United States Patent [19]

Kano et al.

[11] 3,763,408

[45] Oct. 2, 1973

[54] SCHOTTKY BARRIER SEMICONDUCTOR DEVICE HAVING A SUBSTANTIALLY NON-CONDUCTIVE BARRIER FOR PREVENTING UNDESIRABLE REVERSE-LEAKAGE CURRENTS AND METHOD FOR MAKING THE SAME

[75] Inventors: Gota Kano, Uguisudai; Mutsuo Iizuka, Oaza-Hoshida; Shohei Fujiwara; Hiromasa Hasegawa, both of Takatsuki City; Tsukasa Sawaki, Toyonaka City, all of Japan

[73] Assignee: Matsushita Electronics Corporation, Kadoma City, Japan

[22] Filed: Aug. 15, 1969

[21] Appl. No.: 850,535

[30] Foreign Application Priority Data

Aug. 19, 1968 Japan ............................... 43/59371

[52] U.S. Cl. ..... 317/235 R, 317/234 R, 317/234 M, 317/235 M, 317/235 U, 317/235 AJ

[51] Int. Cl. ......................... H01l 11/00, H01l 15/00

[58] Field of Search ...................... 317/234, 235, 26, 317/31, 46.1, 40, 48, 40.1, 47.8

[56] References Cited

UNITED STATES PATENTS

| | | | |
|---|---|---|---|
| 3,280,391 | 10/1966 | Bittmann et al. | 317/235 |
| 3,322,581 | 5/1967 | Hendrickson et al. | 317/235 |
| 3,514,346 | 5/1970 | Cray | 317/235 |
| 3,585,469 | 6/1971 | Jager | 317/235 |
| 3,518,508 | 6/1970 | Yamashita et al. | 317/235 |
| 3,087,099 | 4/1963 | Lehovec | 317/235 |
| 3,424,627 | 1/1969 | Michel et al. | 317/235 X |
| 3,443,041 | 6/1969 | Kahng et al. | 317/235 X |

FOREIGN PATENTS OR APPLICATIONS

| | | | |
|---|---|---|---|
| 1,433,160 | 2/1966 | France | 317/235 |

OTHER PUBLICATIONS

IBM Technical Disclosure Bulletin, Schottky Barrier Diode, by Stiles et al. Vol. 11, No. 1, June 1968, page 20.

IBM Technical Disclosure Bulletin Field Effect Transistor, By DeWitt, Vol. 9, No. 1, June 1966, page 102.

*Primary Examiner*—John W. Huckert
*Assistant Examiner*—Andrew J. James
*Attorney*—Craig & Antonelli

[57] ABSTRACT

A semi-conductor device, such as diode transistor, field effect transistor with a Schottky barrier, has a separation space formed underneath the insulating film covering a major surface portion of the semiconductor substrate. This separation space is disposed adjacent to a metal layer accommodated in a recess in the substrate and extending through an opening in the insulating film, so as to eliminate unreasonable reverse leakage current, by effectively insulating the Schottky barrier from the electric charge accumulation layer beneath the insulating film.

17 Claims, 7 Drawing Figures

INVENTORS
GOTA KANO, MUTSUO IIZUKA, SHOHEI FUJIWARA, HIROMASA HASEGAWA AND TSUKASA SAWAKI

BY
Craig, Antonelli, Stewart & Hill
ATTORNEYS

SCHOTTKY BARRIER SEMICONDUCTOR DEVICE HAVING A SUBSTANTIALLY NON-CONDUCTIVE BARRIER FOR PREVENTING UNDESIRABLE REVERSE-LEAKAGE CURRENTS AND METHOD FOR MAKING THE SAME

BACKGROUND OF THE INVENTION

This invention relates to a semi-conductor device having at least one Schottky barrier formed between a semi-conductor and a metal layer, and to a method of making such semi-conductor device. More particularly, this invention relates to a semi-conductor device having the reverse breakdown voltage as high as about twice that of the conventional one, and to a method of making the same.

It is known that semi-conductor devices, such as diodes or transistors can be made by forming one or more Schottky barriers in the same. Such a device is described by reference to FIG. 1, which illustrates a cross-sectional elevation view of the device, wherein an insulating film 2, such as silicon oxide, is formed on the surface of an epitaxially grown n-type layer 1' of a silicon substrate 1. Through an opening 3 which is opened through the insulating film 2, a layer 4 of metal such as molybdenum is deposited so as to form a Schottky barrier 6 between the metal layer 4 and the surface of the epitaxially grown layer 1'. In a conventional semi-conductor device having such Schottky barrier, the reverse breakdown voltage is usually lower than what is theoretically expected; namely, in a device of aforementioned constitution, in which the semi-conductor substrate is a silicon substrate having an epitaxially grown n-type region 1' of 1 micron thickness and 0.5 ohm-cm resistivity, which is theoretically expected to have reverse breakdown voltage of 20 volts, the actually obtained breakdown voltage is as low as 5 to 10 volts. The reason of such decrease in the reverse breakdown voltage from the theoretical value is explained by referring to FIG. 2, which is a cross-sectional elevation view of the device illustrated in FIG. 1. In such Schottky barrier device, as a result of the formation of an electric charge accumulation layer 5 in a part of the semi-conductor substrate 1 closely underneath the insulating film 2, a leakage current from the metal layer 4 to the accumulation layer 5 flows as indicated by arrows *r* and *r'*. Such leakage current is responsible for the decrease in the reverse breakdown voltage.

In order to improve the characteristics of such a device, there has been proposed heretofore to form a circular p-n junction or a so-called guard ring between the metal layer and the part of the semi-conductor substrate where the accumulation layer is liable to be formed. Although efficient for improving the characteristics, formation of this circular junction has the drawback of being expensive in manufacture, and therefore, is not practical.

SUMMARY OF THE INVENTION

Accordingly, it is the object of the present invention to provide an improved semi-conductor device and also a method of making the same.

More particularly, the object of the present invention is to provide an improved Schottky barrier semi-conductor device having a reverse breakdown voltage as high as about twice that of the conventional Schottky barrier semiconductor devices.

The semi-conductor device of the present invention comprises:

a semi-conductor substrate having a recess formed in a specified region;

an insulating film covering a major surface portion of the semi-conductor substrate but exposing by its opening a major part of the recess, so that a side-etched separation space extending around the recess is located underneath the insulation film;

a metal layer deposited to cover the recess and the surrounding insulating film while leaving the side-etched separation space vacant, so that a Schottky barrier surrounded by the separation space is formed in the recess.

The semi-conductor device according to the present invention constitutes a semi-conductor device of the planar type construction. The metal layer deposited on the recessed surface of the n-type region of semi-conductor substrate forms a Schottky rectifying barrier therebetween. The vacant side-etched separation space, located underneath the insulating film and around the metal layer deposited in the recessed surface, serves to insulate the Schottky barrier from the electric charge accumulation layer so as to eliminate the undesirable reverse leakage current, and consequently to improve the reverse breakdown voltage of the device.

BRIEF DESCRIPTION OF THE DRAWINGS

The invention will be more fully understood by reference to the following detailed description of the specific embodiments thereof taken in conjunction with the drawings, wherein.

DETAILED DESCRIPTION

Figure 1:
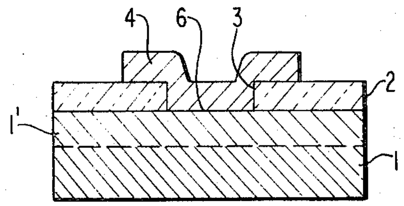
FIG. 1 PRIOR ART
FIG. 1 is a cross-sectional elevation view of a semi-conductor device of the prior art, as described hereinabove.
Figure 2:
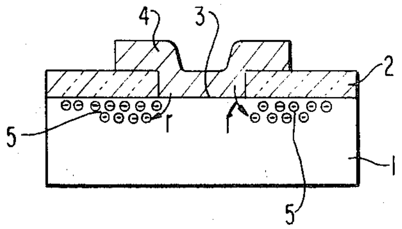
FIG. 2 PRIOR ART
FIG. 2 is a cross-sectional elevation view of the semi-conductor device of FIG. 1, illustrating schematically the drawbacks thereof as described above.
Figure 3:
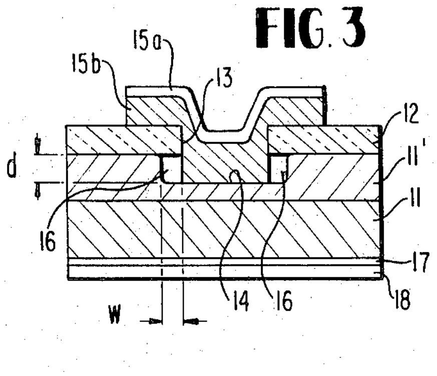
FIG. 3 is a cross-sectional elevation view of a semi-conductor diode in accordance with the present invention.

Referring now to FIG. 3, an insulation film 12 is formed on the surface of an n-type epitaxially grown region 11', grown on a silicon substrate 11. Then, an opening 13 is formed by any known photo-etching method so as to expose a preselected part of the surface of the epitaxially grown region 11'. Subsequently, the surface of the region 11' exposed by the opening 13 is chemically etched in a conventional manner through the opening 13, for example, by means of immersion in a bath prepared by mixing nitric acid, fluoric acid and acetic acid in the volume ratio of 6:1:2, making use of the insulating film as an etching mask.

In the above chemical etching, the epitaxially grown region 11' is engraved both perpendicularly, i.e., downwardly and horizontally, i.e., radially. Such horizontal, i.e., radial, etching is termed side-etching. It has been found experimentally that the etching front underneath the insulating film 12 in the horizontal, i.e., radial, direction advances at the speed of one-third of that in the perpendicular, i.e., downward, direction.

As a result of this chemical etching, a recess 14 is formed in the epitaxially grown region 11' in such a way that the edge of the chemically etched recess 14 extends underneath the insulating film 12 and beyond the boundary of the opening 13 on account of the side-etching. Thus, a circular side-etched separation space 16 extending around the recess 14 underneath the insulation film 12 is formed. The width "W" of the side-etched separation space 16 indicated in FIG. 3 may preferably have a value of at least 1000A, and, accordingly, the depth "*d*" of the recess preferably at least 3000A for sufficient improvement of reverse breakdown voltage.

Subsequently, a layer **15*b* of metal, such as molybdenum or tungsten, is deposited by a conventional vacuum deposition method or by a conventional sputtering method through the opening 13 onto the bottom of the recess 14, in such a way that the side-etched separation space or guard space 16 is left vacant underneath the insulation film 12. A Schottky rectifying barrier is formed between the metal layer 15*b* and the recessed surface 14 of the epitaxially grown layer 11'. Then, a protective layer 15*a* of metal such as gold is deposited on the metal film 15*b*. A layer 17 of metal, such as gold containing 3 percent of antimony, is deposited on the opposite surface of the semi-conductor substrate 11, so that an ohmic contact is obtained between the substrate 11 and the lead-out metal layer 18** deposited thereon.

In the above semi-conductor device, the side-etched separation space or guard space 16 serves to insulate the metal layer **15*b* from the electric charge accumulation layer which develops in a part of the epitaxially grown region 11' closely underneath the insulating film 12.** Consequently, undesirable reverse leakage currents originated by a leaking of electric charges from the accumulation layer to the metal layer is sufficiently eliminated so that no substantial reverse leakage current exists in this device, thereby resulting in good agreement with the theoretical value of the reverse breakdown characteristics.

Particulars of the example described by reference to FIG. 3 are as follows:

Semi-conductor substrate 11 is an n-type silicon substrate having high concentration of at least $10^{19}$ atoms/cm$^3$.

Epitaxially grown layer 11' is an n-type silicon layer having a resistivity of 0.5 ohm-cm and a thickness of 1.5 microns.

Insulation film 12 is a 5000A thick silicon dioxide film.

Opening 13 has a diameter of 25 microns.

Etching in the epitaxially grown layer 11' is effected to reach an etching depth "*d*" of 5000A and a side-etch width "W" of 1600A.

Metal film **15*b*** is formed by sputtering of molybdenum to have a thickness of 5000A and a radius of 50 microns.

Metal film **15*a*** is formed by vacuum-deposition of gold to have a thickness of 5000A and a radius of 50 microns.

The bottom metal layer 17 is formed by vacuum-deposition of gold containing 3 percent of antimony, and the lead-out metal layer 18 of tin is formed thereon.

Figure 4:
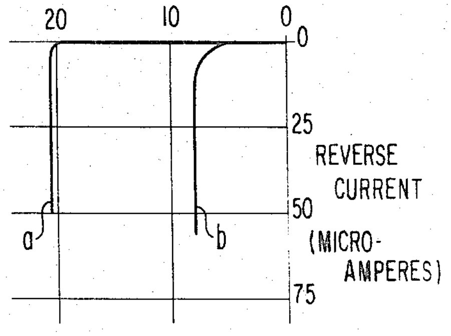
FIG. 4 is a characteristic diagram showing the relation between reverse voltage and reverse current of an example of the diode shown in FIG. 3.

Characteristic curves of the above example are shown in FIG. 4, wherein the reverse current in micro-amperes is plotted along the ordinate and the reverse voltage in volts is plotted along the abscissa, and wherein the curve *a* indicates the characteristic curve of the above-described device in accordance with the present invention and the curve *b* that of the conventional Schottky barrier device.

As is shown in and understood from FIG. 4, the above device of the present invention has a reverse breakdown voltage twice as high or more than that of the conventional construction, showing good agreement with the theoretical value.

As can be easily understood from the above description, the device of the present invention can be easily made, because the forming of the guard space or side-etched separation space can be made by simple chemical etching utilizing the insulation film as an etching mask.

Application of this invention is not confined to the diode shown in the above example, but it is also applicable to Schottky barrier transistors, field-effect transistors or integrated circuits including Schottky barrier elements.

Figures 5, 6:
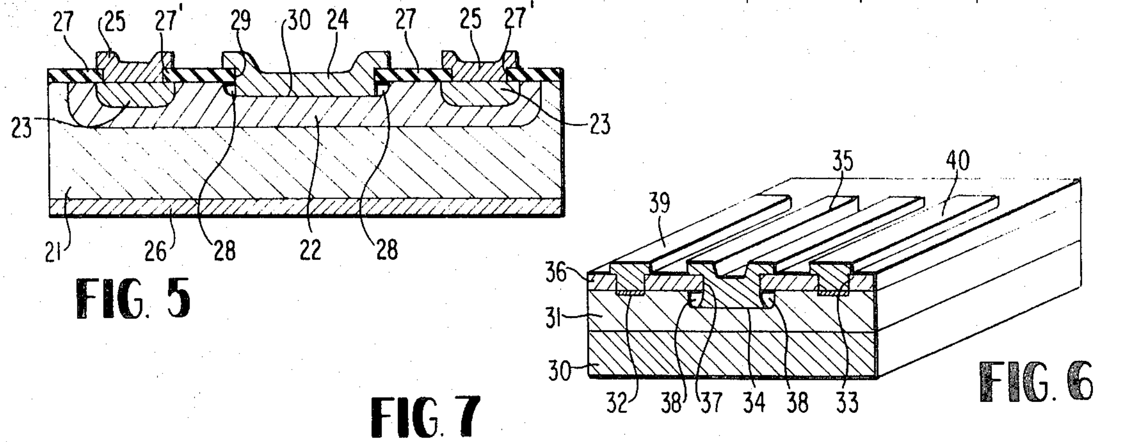
FIG. 5 is a cross-sectional elevation view of a transistor in accordance with the present invention.
FIG. 6 is a partly cut-open perspective view of another transistor in accordance with the present invention.

An example of a transistor having a Schottky barriers as an emitter-base junction is described hereinafter by reference to FIG. 5. A p-type base region 22 is provided by a conventional diffusion method or by a conventional epitaxial growth method on a surface of an n-type silicon substrate 21, and a pair of highly concentrated p-type regions 23 and 23 are provided by a conventional diffusion method so as to form ohmic contacts with the base region 22.

Then, an insulation film 27, such as of silicon oxide or silicon nitride, is provided on the surface of the substrate 21. Subsequently, preferably a round opening 29 is made in the insulating film 27 by any known method, for instance, photo-etching, so as to expose therethrough the surface of the base region 22. The exposed surface of the base region 22 is then chemically etched by any known method, for instance, immersion in a bath prepared by mixing nitric acid, fluoric acid, and acetic acid in the volume ratio of 6:1:2, making use of the insulating film 27 as an etching mask.

In the above chemical etching, the base region 22 is engraved both perpendicularly, i.e., downwardly, and horizontally, i.e., radially.

As a consequence of this chemical etching, a recess 28 is formed in the base region 22 in such a way that the edge of the chemically etched recess extends underneath the insulating film 27 and beyond the boundary of the opening 29 on account of the side-etching. Thus, a circular side-etched separation space 28 extending around the recess 30 underneath the insulation film 27 is formed. The width of the side-etched separation space 28 may preferably have a value of at least 1000A, and the depth of the recess 30 is preferably at least 3000A.

Subsequently, an emitter electrode layer 24 of metal, such as molybdenum, tungsten, gold, platinum, or palladium is deposited by a conventional vacuum deposition method or by a conventional sputtering method through the opening 29 onto the bottom of the recess 30, in such a way that the side-etched separation space or guard space 28 is left vacant underneath the insulating film 27. A Schottky barrier is formed between the metal layer 24 and the recessed surface 30 of the base region 22.

In the above Schottky barrier transistor, the side-etched separation space or guard space 28 serves to insulate the Schottky barrier from the electric accumulation layer or the surface level in a part of the base region 22 under the insulation film 27. Consequently, the device of the present invention has very low noise in the audio-frequency range. A base electrode can be easily formed by only depositing layers 25 and 25 of a metal, such as molybdenum, tungsten, etc., which can be deposited simultaneously with the layer 24 through openings 27′ and 27′ onto the heavily doped regions 23 and 23, because the regions 23 and 23 are doped to have a concentration exceeding $10^{18}$ atoms/cm$^3$, so that substantial ohmic contact can be obtained therebetween.

A layer 26 of metal, such as gold containing 3 percent of antimony, is deposited on the opposite surface of the semi-conductor substrate 21, so that an ohmic contact is obtained between the substrate 21 and the collector electrode 26.

The transistor constituted as set forth above operates as a Schottky barrier transistor when, in a circuit, layer 26 is connected to operate as a collector electrode, the layers 25, 25, as base electrode, and the layer 24 as an emitter electrode.

Although the above example is of a transistor having a Schottky barrier functioning as a base-emitter junction, other examples can be constituted embodying the present invention, for instance, a transistor having a Schottky barrier functioning as a base-collector junction, or a transistor having two Schottky barriers functioning as base-emitter and base-collector junctions.

In the transistors thus constituted to have at least one Schottky barrier, an adverse influence by an uncontrollable accumulation layer can be substantially eliminated since the Schottky barrier is efficiently insulated from the electric charge accumulation layer, thus sufficiently improving noise characteristics of the transistor.

Moreover, high frequency characteristics of the transistor can also be improved because the thickness of the base region is reduced as a result of the chemical etching.

This invention is also applicable to the manufacture of a field-effect transistor having a Schottky barrier gate.

The conventional field-effect transistor of the Schottky barrier type has the drawback that its gate current is not negligible owing to the surface level or electric charge accumulation layer. Such drawback can be eliminated by applying the present invention.

An example of the Schottky barrier type field-effect transistor is explained hereinafter referring to FIG. 6. As is shown in FIG. 6, such field-effect transistor comprises a semi-conductor substrate 30′ having a recess formed in an epitaxially grown region 31. An insulating film 36 covers a major surface portion of the region 31 but exposes by its gate opening 37 a major part of the recess so that a side-etched separation spaced 38 extending around the recess is located underneath the insulating film 36. A gate electrode 35 is deposited to cover the recess and the surrounding insulating film while leaving the side-etched separation space 38 vacant, so that a gate Schottky barrier 34 surrounded by the separation space is formed in the recess. In openings 32 and 33 formed on both sides of the gate electrode 35 in the insulating film 36 are provided a source electrode 39 and a drain electrode 40, respectively.

Such a device is manufactured by the following steps: First, an insulating layer 36 of silicon oxide is formed on the major surface portion of the epitaxially grown layer 31 having high resistivity and grown on the silicon substrate 30 of lower resistivity. Then, the gate opening 37 is formed by means of the known photo-etching method so as to expose the surface of the epitaxially grown layer 31. The exposed surface is chemically etched through the opening 37, perpendicularly downwardly and horizontally underneath the insulating film 36, utilizing the insulating film 36 as a mask, so as to form a recess in the opening 37 and also a side-etched separation space 38 extending around the recess. Subsequently, a gate electrode 35 is formed by depositing a layer of metal such as molybdenum or tungsten to cover the recess and the neighboring part of the insulating film 36 while leaving the side-etched separation space 38 vacant, so that a Schottky barrier surrounded by this separation space 38 is formed in the recess between the epitaxially grown region 31 and the metal layer. A source electrode 39 and a drain electrode 40 are formed by vacuum-depositing gold containing 3 percent of antimony, in the opening 32 and opening 33, respectively, opened by any known method in the insulating film 36.

Figure 7:
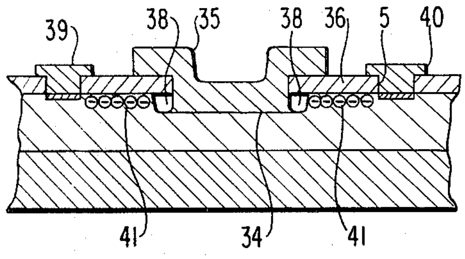
FIG. 7 is a partial cross-sectional elevation view of the transistor illustrated in FIG. 6.

As is illustrated in FIG. 7, in the above field-effect transistor, the side-etched separation space 38 insulates the Schottky barrier 34 underneath the gate electrode 35 from the electric charge accumulation layer 41, and accordingly, a leakage current which flows when a reverse voltage is applied between the silicon substrate 30 and the gate electrode 35, can be substantially eliminated.

It has been experimentally proved that the side-etching width of the separation space 38 is roughly one-third of the etching depth of the separation space 38, i.e., the etching depth of the recess, and that this etching depth is preferably at least 3000A.

An example of the field-effect transistor of the present invention is manufactured in the following particulars:

The semi-conductor substrate 30′ is a $p^+$-type silicon substrate of 10 ohm-cm resistivity, having on it a $n$-type epitaxially grown layer 31 of 1.5 micron thickness and 0.5 ohm-cm resistivity.

The insulating film 36 is a silicon dioxide film of 5000A thickness.

The gate electrode 35 is formed by sputtering molybdenum in the recess.

The depth of both the recess and the side-etched separation space 38 is 3000A, and the width of the separation space 38 is 1000A.

The source electrode 32 and the drain electrode 33 are both formed by vacuum deposition of a layer of gold containing 3 percent of antimony so as to form ohmic contacts with the epitaxially grown layer 31.

The following table shows characteristics of the above field-effect transistor.

TABLE

Drain current (at a drain-source voltage of 10 volts, and a gate-source voltage of 0 volt) — 10 milliamperes
Cut-off voltage (at the drain current of 50 microamperes) — −5 volts
Gate-leakage current (at a gate-source voltage of 10 volts, and at a drain-source voltage of 0 volt) — 100 milliamperes
Transconductance (at a drain-source voltage of 10 volts, at a drain current of 5 milliamperes, and at a frequency of 455 kilo Hz) — 5 to 10 milli-mho
Input capacity (at a drain-source voltage of 0 volt, at a drain-source voltage of 0 volt, and at a frequency of 455 kilo Hz) — 5 pico-farads
Maximum drain voltage — 20 volts
Maximum drain current — 15 milliamperes
Maximum gate voltage — 15 volts

We claim:

1. A semiconductor device which comprises:

a semiconductor substrate having a recess formed in a specified region thereof;

an insulating film covering the major surface portion of said semiconductor substrate and having an opening therethrough, exposing a major part of the bottom of said recess, said opening being disposed above said recess, the cross-sectional area of said opening being less than the cross-sectional area of said recess, so as to provide a separation space in said semiconductor substrate extending around the portion of the recess located underneath the insulating film; and a Schottky barrier formed at the bottom of said recess including a metal layer covering the opening in said insulating film and extending through said opening onto the bottom of said recess while leaving said separation space substantially vacant, said space extending to the base of said recess in said semiconductor substrate where said metal layer forms said Schottky barrier with said substrate and being surrounded by the wall of said recess, so that said Schottky barrier is surrounded by the separation space extending around the recess.

2. The semi-conductor device according to claim 1, wherein the width of said separation space is at least 1000A.

3. The semi-conductor device according to claim 1, wherein the semi-conductor substrate is of silicon, the insulating film is of silicon dioxide, and the metal layer is a molybdenum film.

4. A Schottky barrier type transistor which comprises:

a semiconductor substrate having a recess formed in a base region thereof, an insulating film covering a major surface portion of said semiconductor substrate and having an opening therethrough, exposing a major part of the bottom of said recess, said opening being disposed above said recess, the cross-sectional area of said opening being less than the cross-sectional area of said recess, so as to provide a separation space in said semiconductor substrate extending around the recess and located underneath the insulating film, a Schottky barrier formed at the bottom of said recess including a metal layer covering the opening in said insulating film and extending through said opening onto the bottom of said recess and the surrounding insulating film while leaving said separation space substantially vacant, said space extending to the base of said recess in said semiconductor substrate where said metal layer forms said Schottky barrier with said substrate and being surrounded by the wall of said recess, so that said Schottky barrier is surrounded by the separation space extending around the recess, another metal layer deposited through a hole opened through the insulating film, so as to make ohmic contact with the base region, and a further metal layer deposited on the part other than the base region of the substrate, so as to make ohmic contact therewith.

5. The Schottky barrier type transistor according to claim 4, wherein the width of said separation space is at least 1000A.

6. The Schottky barrier type transistor according to claim 4, wherein the insulating film is of silicon dioxide, and the first metal layer is a molybdenum film.

7. A Schottky barrier type semiconductor device which comprises:

a semiconductor substrate having a recess formed in a specified region;

an insulating film of a chemical compound of the semiconductor material covering a major surface portion of said semiconductor substrate but exposing by its opening a major part of said recess with a side-etched separation space extending around the recess located underneath the insulating film;

a metal layer covering said recess and the surrounding insulating film while leaving said separation space substantially vacant, and a Schottky barrier which is formed on a contact face between said metal layer and said recess and is surrounded by the separation space, said separation space extending to the base of said recess in said semiconductor substrate at the location where said Schottky barrier is formed and being surrounded by the wall of said recess.

8. The semi-conductor device according to claim 7, wherein the width of said separation space is at least 1,000 A.

9. The semi-conductor device according to claim 7, wherein the semi-conductor substrate is made of silicon, the insulating film is made of silicon dioxide, and the metal layer is a molybdenum film.

10. A semiconductor device with a Schottky barrier, in which an insulating film covers a major surface portion of a semiconductor substrate, in which an opening is provided in the insulating film to expose a defined area of the substrate, and in which a metal layer covers the area of the substrate exposed through the opening to form said Schottky barrier, characterized in that a guard space separating the metal layer from an electric charge accumulation layer is provided to effectively prevent undesirable reverse-leakage currents caused by leakage to the metal layer of electric charges from the accumulation layer formed in parts of the semiconductor substrate closely underneath the insulating film, said guard space comprising a recess formed in said substrate surrounding said metal layer, the cross-sectional area of said opening being less than the cross-sectional area of said recess, so as to provide a separation space in said substrate that extends around the portion of the recess located underneath said insulating film, said separation space extending to the base of said recess in said semiconductor substrate at the location where said Schottky barrier is formed.

11. A semiconductor device comprising:

a semiconductor substrate having a recess formed in one surface thereof;

an insulating film formed on said one surface of said substrate within which said recess is formed, said insulating film overlapping a portion of said recess and having an opening therethrough, the cross-sectional area of which is less than the cross-sectional area of said recess, forming a separation space extending around the edges of the recess and located underneath the overlapping portion of said insulating film; and a Schottky barrier formed at the bottom of said recess comprising a metal layer formed on said insulating film and extending through said opening onto the bottom of said recess so as to form said Schottky barrier between said metal layer and the bottom of said recess, the cross-sectional area of said metal layer which so extends onto the bottom of said recess having a cross-sectional area substantially the same as said opening, said separation space extending to the base of said recess in said semiconductor substrate where said metal layer forms said Schottky barrier with said substrate and being surrounded by the wall of said recess, whereby said separation space remains substantially vacant and said Schottky barrier is surrounded by said separation space formed in said recess, thereby insulating said metal layer from an electric charge accumulation layer in the portion of said substrate adjacent said recess and underneath said insulating film.

12. The semi-conductor device according to claim 11, wherein the width of said separation space is at least 1,000 A.

13. The semi-conductor device according to claim 11, wherein the semi-conductor substrate is made of silicon, the insulating film is made of silicon dioxide, and the metal layer is a molybdenum film.

14. In a Schottky barrier type semiconductor device having a semiconductor substrate, an insulating film covering a major portion of said substrate, an opening extending through said insulating film exposing a defined area of said substrate, and a metal layer covering the area of said substrate exposed through said opening to form a Schottky barrier, the improvement comprising means for effectively preventing undesirable reverse leakage currents caused by leakage to said metal layer of electric charges from an accumulation layer formed in parts of said semiconductor substrate closely beneath said insulating film, said means comprising a substantially non-conductive barrier guard space separating said metal layer from the electric charge accumulation layer, said guard space comprising a recess formed in said substrate surrounding said metal layer beneath said opening, the cross-sectional area of said opening being less than the cross-sectional area of said recess, so as to provide a separation space in said substrate that extends around the portion of the recess located underneath said insulating film, said separation space extending to the base of said recess in said semiconductor substrate at the location where said Schottky barrier is formed.

15. A field-effect transistor which comprises:

a semiconductor substrate having a recess formed in its major surface, an insulating film covering said major surface of said semiconductor substrate and having an opening therethrough, exposing a major part of the bottom of said recess, said opening being disposed above said recess, the cross-sectional area of said opening being less than the cross-sectional area of said recess, so as to provide a separation space extending around the portion of the recess located underneath the insulating film, a Schottky barrier formed at the bottom of said recess including a gate electrode layer covering the opening in said insulating film and extending through said opening onto the bottom of said recess while leaving said separation space substantially vacant, said separation space extending to the base of said recess in said semiconductor substrate at the location where said Schottky barrier is formed, so that said Schottky barrier is surrounded by the separation space extending around the recess, and a source electrode layer and a drain electrode layer, deposited through respective holes opened through the insulating film and located on opposite sides of the gate electrode, so as to make ohmic contact with the substrate.

16. The field-effect transistor according to claim 15, wherein the width of said separation space is at least 1000A.

17. The field-effect transistor according to claim 15, wherein the insulating film is of silicon dioxide, and the gate electrode layer is a molybdenum film.

* * * * *